(12) United States Patent
Li et al.

(10) Patent No.: US 12,466,858 B2
(45) Date of Patent: Nov. 11, 2025

(54) HELPER PLASMID AND METHOD FOR PREPARING RECOMBINANT ADENO-ASSOCIATED VIRUS

(71) Applicant: PACKGENE BIOTECH CO., LTD., Guangdong (CN)

(72) Inventors: Huapeng Li, Guangdong (CN); Jia Liu, Guangdong (CN); Wanwen Xie, Guangdong (CN)

(73) Assignee: PACKGENE BIOTECH CO., LTD., Guangzhou (CN)

( * ) Notice: Subject to any disclaimer, the term of this patent is extended or adjusted under 35 U.S.C. 154(b) by 187 days.

(21) Appl. No.: 18/377,827

(22) Filed: Oct. 8, 2023

(65) Prior Publication Data

US 2024/0076319 A1    Mar. 7, 2024

Related U.S. Application Data

(63) Continuation of application No. PCT/CN2022/078621, filed on Mar. 1, 2022.

(30) Foreign Application Priority Data

Apr. 8, 2021 (CN) .................. 202110377907.X

(51) Int. Cl.
  *C07K 14/005* (2006.01)
  *C12N 7/00* (2006.01)
  *C12N 15/63* (2006.01)

(52) U.S. Cl.
  CPC .............. *C07K 14/005* (2013.01); *C12N 7/00* (2013.01); *C12N 15/63* (2013.01); *C12N 2750/14122* (2013.01); *C12N 2750/14143* (2013.01)

(58) Field of Classification Search
  None
  See application file for complete search history.

(56) References Cited

U.S. PATENT DOCUMENTS

2003/0152914 A1    8/2003    Kaplitt et al.
2004/0209364 A1   10/2004    Grimm et al.

FOREIGN PATENT DOCUMENTS

| CN | 1657631 A | 8/2005 | |
|---|---|---|---|
| CN | 106884014 A | 6/2017 | |
| CN | 107295802 A | 10/2017 | |
| WO | WO-02097056 A2 * | 12/2002 | ............. C12N 15/86 |

OTHER PUBLICATIONS

Zhou et al., "Deletion of the B-B' and C-C' regions of inverted terminal repeats reduces rAAV productivity but increases transgene expression" Nature Scientific Reports (Year: 2017).*
Addgene "Adeno-associated virus (AAV) guide" Wayback machine: https://web.archive.org/web/20200106151937/https://addgene.org:80/guides/aav/ (Year: 2020).*
Notice of Allowance of counterpart Chinese Patent Application No. 202111577936.7 issued on Aug. 23, 2023.
First Office Action of counterpart Chinese Patent Application No. 202111577936.7 issued on May 27, 2023.
Musatov, S. et al., A cis-Acting Element That Directs Circular Adeno-Associated Virus Replication and Packaging, Journal of Virology, Dec. 31, 2002, p. 12792-12802, vol. 76, No. 24.
Xiao Xiao et al., Production of High-Titer Recombinant Adeno-Associated Virus Vectors in the Absence of Helper Adenovirus, Journal of Virology, Mar. 1998, p. 2224-2232, vol. 72, No. 3.
Flotte TR et al., Expression of the Cystic Fibrosis Transmembrane Conductance Regulator from a Novel Adeno-associated Virus Promoter, The Journal of Biological Chemistry, Feb. 15, 1993, pp. 3781-3790, vol. 268, No. 5.
Lei Zhang et al., Efficient expression of CFTR function with adeno-associated virus vectors that carry shortened CFTR genes, Proc. Natl. Acad. Sci. USA, Aug. 18, 1998, pp. 10158-10163, vol. 95.
International Search Report of PCT Patent Application No. PCT/CN2022/078621 issued on May 27, 2022.

* cited by examiner

*Primary Examiner* — Robert M Kelly
*Assistant Examiner* — John David Moore

(57) ABSTRACT

The present application provides a helper plasmid for preparing a recombinant adeno-associated virus (rAAV), including: 1) a coding sequence of an AAV Rep protein and a coding sequence of an AAV Cap protein; 2) at least one promoter sequence; and 3) at least one DA' sequence or AD' sequence, wherein the AD' sequence is a reverse complementary sequence of the DA' sequence. The present application also provides a method for increasing a production capacity of a rAAV using the helper plasmid. With an AD' sequence or a DA' sequence, the helper plasmid provided in the present application can significantly increase an AAV yield of a cell.

8 Claims, 3 Drawing Sheets
Specification includes a Sequence Listing.

(B'B, SEQ ID NO: 7)

```
         T
       T   T
       C - G
       C - G
       A - T
       G - C
  B'   C - G   B
       G - C
       G - C                        (AD', SEQ ID NO: 3)
       G - C
       C - C           A                              D'
       C - GGCCTCAGTGAGCGAGCGAGCGCGCAGAGAGGGAGTGGCCAACTCCATCACTAGGGGTTCCT -3'OH
       T -  |||||||||||||||||||||||||||||||||||||||||||||||||||||||||||
       G - CCGGAGTCACTCGCTCGCTCGCGCGTCTCTCCCTCACCGGTTGAGGTAGTGATCCCCAAGGA-5'P
       C - G           A'                             D
       G - C
       G - C                       (DA', SEQ ID NO: 4)
       G - C
       C - G
  C'   C - G   C
       C - G       (CC', SEQ ID NO: 8)
       G - C
       A   A
         A
```

FIG. 1

SEQUENCE LISTING

```
Sequence total quantity: 8
SEQ ID NO: 1            moltype = DNA  length = 2971
FEATURE                 Location/Qualifiers
source                  1..2971
                        mol_type = other DNA
                        organism = synthetic construct
misc_feature            1..2971
                        note = synthetic
SEQUENCE: 1
aagccgaatt ctgcagatat ccatcacact ggcggccgct cgactagagc ggccgccacc    60
gcggtggagc tccagctttt gttcccttta gtgagggtta attgcgcgct tggcgtaatc   120
atggtcatag ctgtttcctg tgtgaaattg ttatccgctc acaattccac acaacatacg   180
agccggaagc ataaagtgta aagcctgggg tgcctaatga gtgagctaac tcacattaat   240
tgcgttgcgc tcactgcccg ctttccagtc gggaaacctg tcgtgccagc tgcattaatg   300
aatcggccaa cgcgcgggga gaggcggttt gcgtattggg cgctcttccg cttcctcgct   360
cactgactcg ctgcgctcgg tcgttcggct gcggcgagcg gtatcagctc actcaaaggc   420
ggtaatacgg ttatccacag aatcagggga taacgcagga agaacatgt gagcaaaagg   480
ccagcaaaag gccaggaacc gtaaaaaggc cgcgttgctg gcgtttttcc ataggctccg   540
ccccctgac gagcatcaca aaaatcgacg ctcaagtcag aggtggcgaa acccgacagg   600
actataaaga taccaggcgt ttccccctgg aagctccctc gtgcgctctc ctgttccgac   660
cctgccgctt accggatacc tgtccgcctt tctcccttcg ggaagcgtgg cgctttctca   720
tagctcacgc tgtaggtatc tcagttcggt gtaggtcgtt cgctccaagc tgggctgtgt   780
gcacgaaccc cccgttcagc ccgaccgctg cgccttatcc ggtaactatc gtcttgagtc   840
caacccggta agacacgact tatcgccact ggcagcagcc actggtaaca ggattagcag   900
agcgaggtat gtaggcggtg ctacagagtt cttgaagtgg tggcctaact acggctacac   960
tagaagaaca gtatttggta tctgcgctct gctgaagcca gttaccttcg gaaaaagagt  1020
tggtagctct tgatccggca aacaaaccac cgctggtagc ggtggttttt ttgtttgcaa  1080
gcagcagatt acgcgcagaa aaaaaggatc tcaagaagat cctttgatct tttctacggg  1140
gtctgacgct cagtggaacg aaaactcacg ttaagggatt ttggtcatga gattatcaaa  1200
aaggatcttc acctagatcc ttttaaatta aaaatgaagt tttaaatcaa tctaaagtat  1260
atatgagtaa acttggtctg acagttacca atgcttaatc agtgaggcac ctatctcagc  1320
gatctgtcta tttcgttcat ccatagttgc ctgactcccc gtcgtgtaga taactacgat  1380
acgggagggc ttaccatctg gccccagtgc tgcaatgata ccgcgagacc cacgctcacc  1440
ggctccagat ttatcagcaa taaaccagcc agccggaagg gccgagcgca gaagtggtcc  1500
tgcaacttta tccgcctcca tccagtctat taattgttgc cgggaagcta gagtaagtag  1560
ttcgccagtt aatagtttgc gcaacgttgt tgccattgct acaggcatcg tggtgtcacg  1620
ctcgtcgttt ggtatggctt cattcagctc cggttcccaa cgatcaaggc gagttacatg  1680
atccccccatg ttgtgcaaaa aagcggttag ctccttcggt cctccgatcg ttgtcagaag  1740
taagttggcc gcagtgttat cactcatggt tatggcagca ctgcataatt ctcttactgt  1800
catgccatcc gtaagatgct tttctgtgac tggtgagtac tcaaccaagt cattctgaga  1860
atagtgtatg cggcgaccga gttgctcttg cccggcgtca tacgggata taccgcgcc   1920
acatagcaga actttaaaag tgctcatcat tggaaaacgt tcttcgggc gaaaactctc   1980
aaggatctta ccgctgttga tccagttcga tgtaaccac actcgtgcac ccaactgatc   2040
ttcagcatct tttactttca ccagcgtttc tgggtgagca aaaacaggaa ggcaaaatgc   2100
cgcaaaaaag ggaataaggg cgacacgaaa atgttgaata ctcatactct tcctttttca   2160
atattattga agcatttatc aggggttattg tctcatgagc ggatacatat ttgaatgtat   2220
ttagaaaaat aaacaaatag gggttccgcg cacatttccc cgaaaagtgc cacctaaatt   2280
gtaagcgtta atattttgtt aaaattcgcg ttaaattttt gttaaatcag ctcatttttt   2340
aaccaatagg ccgaaatcgg caaaatccct tataaatcaa aagaatagac cgagataggg   2400
ttgagtgttg ttccagtttg gaacaagagt ccactattaa agaacgtgga ctccaacgtc   2460
aaagggcgaa aaaccgtcta tcagggcgat ggcccactac gtgaaccatc acctaatca   2520
agttttttgg ggtcgaggtg ccgtaaagca ctaaatcgga accctaaagg gagcccccga   2580
tttagagctt gacgggaaa gccggcgaac gtggcgagaa aggaagggaa gaaagcgaaa   2640
ggagcggcg ctaggcgct ggcaagtgta gcggtcacg tgcgcgtaac caccacaccc    2700
gccgcgctta atgcgccgct acagggcgcg tcccattcgc cattcaggct gcgcaactgt   2760
```

-continued

```
tgggaagggc gatcggtgcg ggcctcttcg ctattacgcc agctggcgaa aggggatgt   2820
gctgcaaggc gattaagttg ggtaacgcca gggttttccc agtcacgacg ttgtaaaacg   2880
acggccagtg agcgcgcgta atacgactca ctatagggcg aattgggtac cgggccccc   2940
ctcgatcgag gtcgacggta tcgggggagc t                                 2971
```

```
SEQ ID NO: 2              moltype = DNA  length = 132
FEATURE                   Location/Qualifiers
source                    1..132
                          mol_type = other DNA
                          organism = synthetic construct
misc_feature              1..132
                          note = synthetic
SEQUENCE: 2
aggtcctgta ttagaggtca cgtgagtgtt ttgcgacatt ttgcgacacc atgtggtcac   60
gctgggtatt taagcccgag tgagcacgca gggtctccat tttgaagcgg gaggtttgaa   120
cgcgcagccg cc                                                      132
```

```
SEQ ID NO: 3              moltype = DNA  length = 61
FEATURE                   Location/Qualifiers
source                    1..61
                          mol_type = other DNA
                          organism = synthetic construct
misc_feature              1..61
                          note = synthetic
SEQUENCE: 3
gcctcagtga gcgagcgagc gcgcagagag ggagtggcca actccatcac taggggttcc   60
t                                                                  61
```

```
SEQ ID NO: 4              moltype = DNA  length = 61
FEATURE                   Location/Qualifiers
source                    1..61
                          mol_type = other DNA
                          organism = synthetic construct
misc_feature              1..61
                          note = synthetic
SEQUENCE: 4
aggaacccct agtgatggag ttggccactc cctctctgcg cgctcgctcg ctcactgagg   60
c                                                                  61
```

```
SEQ ID NO: 5              moltype = DNA  length = 21
FEATURE                   Location/Qualifiers
source                    1..21
                          mol_type = other DNA
                          organism = synthetic construct
misc_feature              1..21
                          note = synthetic
SEQUENCE: 5
ggaacccta gtgatggagt t                                             21
```

```
SEQ ID NO: 6              moltype = DNA  length = 16
FEATURE                   Location/Qualifiers
source                    1..16
                          mol_type = other DNA
                          organism = synthetic construct
misc_feature              1..16
                          note = synthetic
SEQUENCE: 6
cggcctcagt gagcga                                                  16
```

```
SEQ ID NO: 7              moltype = DNA  length = 22
FEATURE                   Location/Qualifiers
source                    1..22
                          mol_type = other DNA
                          organism = synthetic construct
misc_feature              1..22
                          note = synthetic
SEQUENCE: 7
cgggcgacct ttggtcgccc gg                                           22
```

```
SEQ ID NO: 8              moltype = DNA  length = 21
FEATURE                   Location/Qualifiers
source                    1..21
                          mol_type = other DNA
                          organism = synthetic construct
misc_feature              1..21
                          note = synthetic
SEQUENCE: 8
cgcccgggca aagcccgggc g                                            21
```

HELPER PLASMID AND METHOD FOR PREPARING RECOMBINANT ADENO-ASSOCIATED VIRUS

CROSS REFERENCE TO RELATED APPLICATION

The present application is a continuation application of PCT application No. PCT/CN2022/078621 filed on Mar. 1, 2022, which claims the benefit of Chinese Patent Application No. 202110377907.X filed on Apr. 8, 2021. The contents of all of the aforementioned applications are incorporated by reference herein in their entirety.

REFERENCE TO SEQUENCE LISTING

The Sequence Listing XML file submitted via the USPTO Patent Center, with a file name of "Sequence_Listing.XML", a creation date of Oct. 8, 2023, and a size of 14 KB, is part of the specification and is incorporated in its entirety by reference herein.

TECHNICAL FIELD

The present application relates to genetic engineering and production of an adeno-associated virus (AAV) in a human cell, and specifically relates to a novel helper plasmid for AAV packaging and a use thereof in production of an AAV.

BACKGROUND

Gene therapy is now becoming a reality from a dream of scientists forty years ago. After years of evolution and elimination of various viral and non-viral vectors, recombinant adeno-associated virus (rAAV) vectors are currently recognized as gene therapy vectors that meet the three criteria of safety, efficiency, and specificity. However, due to a limited capacity of large-scale production of AAV in the industry, the popularity of clinical applications of AAV is also restricted accordingly.

Therefore, it is urgent to break the bottleneck of a production capacity of AAV. The improvement and innovation of upstream production to increase an AAV yield is currently one of the key points to reduce a production cost for gene therapy. At present, a three-plasmid transfection method is widely used for production of AAV due to simplicity and rapidity. The three-plasmid transfection method involves co-transfection of HEK293 cells with three plasmids including: a helper plasmid pADhelper that provides four adenovirus elements; a helper plasmid pRC that provides coding sequences of AAV Rep and Cap proteins, where a Rep protein is responsible for replication of a genome of AAV and assistance in assembly of genomic particles of AAV, and a Cap protein is responsible for production of a capsid of AAV; and a target sequence-containing plasmid that can be referred to as pGOI, where a 5' inverted terminal repeat (ITR) sequence and a 3' ITR sequence in a natural genome of AAV are arranged upstream and downstream of a target sequence, respectively.

Typically, in a pRC plasmid for AAV serotype X (AAVX), a coding sequence is composed of Rep2 from AAV serotype 2 (AAV2) and CapX encoding a capsid protein of AAVX; and a P5 promoter is a key promoter for initiating the expression of rep and Cap, and the P5 promoter is usually arranged before a RepCap-coding region, as shown by "P5+RC" in FIG. 2. X. Xiao et al. have reported that the arrangement of a P5 promoter upstream and downstream of RC can increase a yield of AAV[1]. In the target plasmid pGOI, ITRs arranged upstream and downstream of the target gene (or target sequence) each have a total length of 145 bp, which is considered to be related to the replication and guided packaging of a genome of AAV. Because there is an inverted self-complementary sequence in ITR, a T-shaped double-stranded structure will be formed through self-complementation in the case of single-stranded DNA. T. R. Flotte et al. have found that intact ITR has a promoter activity and can drive the expression of a CFTR gene[2]. However, in terms of driving the gene expression, ITR only has a very low transcriptional activity compared with the traditional promoters[3].

SUMMARY

In an aspect, the present application provides a helper plasmid for preparing a rAAV, including: 1) a coding sequence of an AAV Rep protein and a coding sequence of an AAV Cap protein; 2) at least one promoter sequence; and 3) at least one DA' sequence or AD' sequence, wherein the AD' sequence is a reverse complementary sequence of the DA' sequence.

In some embodiments, the at least one DA' sequence or AD' sequence is located upstream of the coding sequence of the AAV Rep protein and the coding sequence of the AAV Cap protein.

In some embodiments, the at least one DA' sequence or AD' sequence is located downstream of the coding sequence of the AAV Rep protein and the coding sequence of the AAV Cap protein.

In some embodiments, the helper plasmid includes sequentially from 5' to 3':
  i) a DA' sequence or an AD' sequence, a promoter sequence, and a coding sequence of an AAV Rep protein and a coding sequence of an AAV Cap protein;
  ii) a DA' sequence or an AD' sequence, a promoter sequence, a coding sequence of an AAV Rep protein and a coding sequence of an AAV Cap protein, and a DA' sequence or an AD' sequence;
  iii) a DA' sequence or an AD' sequence, a promoter sequence, a coding sequence of an AAV Rep protein and a coding sequence of an AAV Cap protein, a DA' sequence or an AD' sequence, and a promoter sequence; or
  iv) a coding sequence of an AAV Rep protein and a coding sequence of an AAV Cap protein, a DA' sequence or an AD' sequence, and a promoter sequence.

In some embodiments, a promoter is a P5 promoter.

In some embodiments, the P5 promoter sequence includes a sequence shown in SEQ ID NO: 2 or a functional variant having a sequence identity of at least 90% with the sequence shown in SEQ ID NO: 2.

In some embodiments, the DA' sequence includes a sequence shown in SEQ ID NO: 4 or a functional variant having a sequence identity of at least 90% with the sequence shown in SEQ ID NO: 4.

In some embodiments, the AD' sequence includes a sequence shown in SEQ ID NO: 3 or a functional variant having a sequence identity of at least 90% with the sequence shown in SEQ ID NO: 3.

In some embodiments, the AAV Rep protein and the AAV Cap protein are derived from AAV2.

In another aspect, the present application provides a method for increasing a production capacity of a rAAV, including: transforming a host cell with the helper plasmid described above.

The present application provides a helper and packaging plasmid for encoding Rep/Cap (including all serotypes), and with an AD' sequence or a DA' sequence, the helper and packaging plasmid can significantly increase an AAV yield of a single cell.

BRIEF DESCRIPTION OF THE DRAWINGS

FIG. 1 is a schematic diagram of an ITR structure of a genome of AAV;

DETAILED DESCRIPTION

Figure 2:
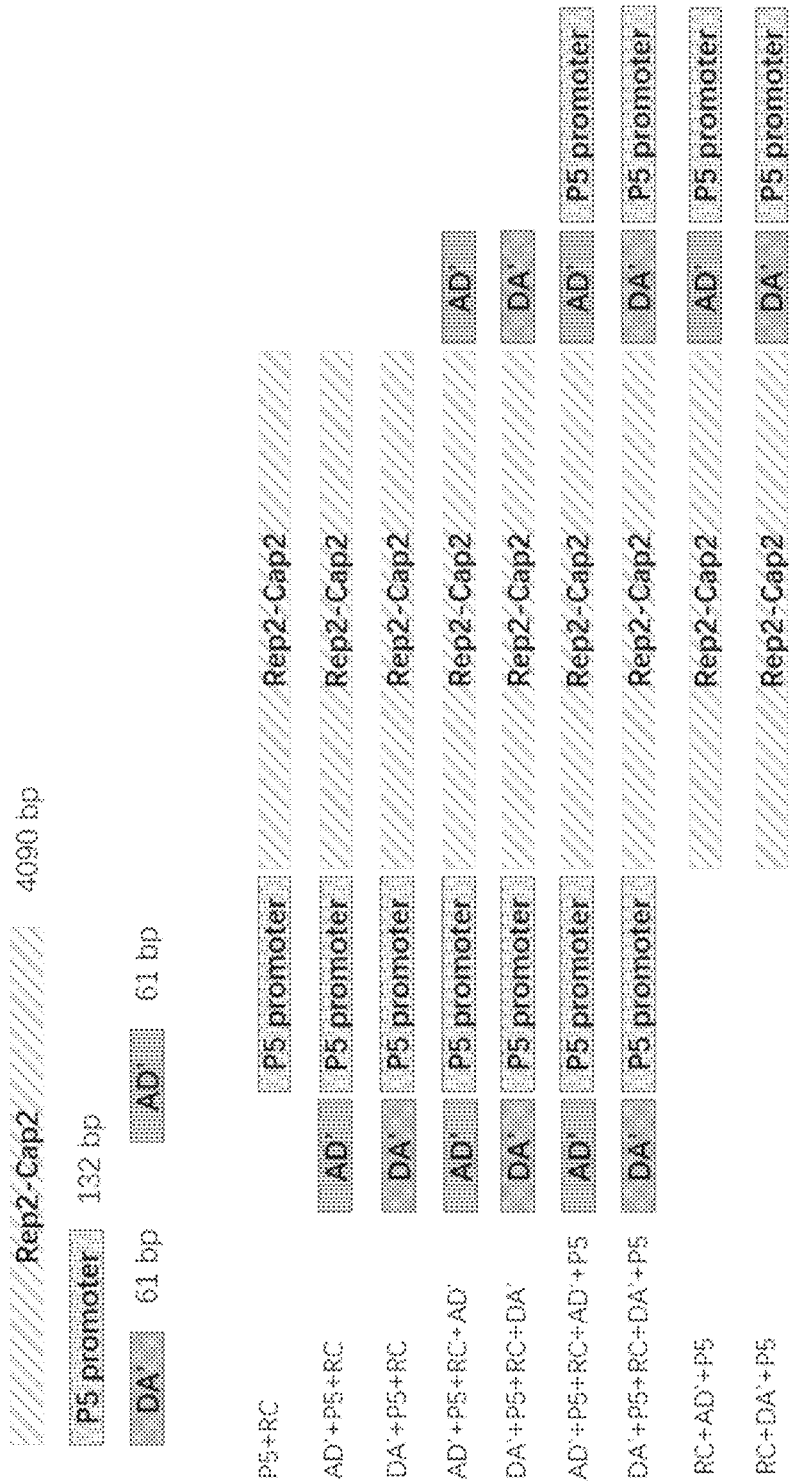
FIG. 2 is a schematic diagram of an experimental design to investigate functions of DA' and AD in an embodiment.

Unless otherwise defined, all technical and scientific terms used herein have meanings commonly understood by those of ordinary skill in the art.

AAV: AAV was found first in adenovirus (AdV) preparations and later in human tissues. AAV belongs to the genus *Dependoparvovirus* in the family Parvoviridae, and is a defective virus with a simple structure. The replication of AAV requires the participation of a helper virus (such as an adenovirus). It is currently believed that AAV will not cause any human diseases, which is a basis for modifying AAV and using modified AAV in gene therapy. A genome of AAV is of about 4.7 kb and is a single-stranded DNA molecule, including two reading frames (rep and cap genes) and two ITRs at termini of the genome. The rep gene encodes a plurality of proteins for viral replication (Rep78, Rep68, Rep52, and Rep40), and the cap gene encodes three subunits of a capsid protein (VP1, VP2, and VP3). ITRs play a key role in the replication and packaging of AAV and are involved in the integration and escape of a viral genome on a genome of a host. ITR sequences (typically 145 bp) can form a T-shaped structure. As shown in FIG. 1, based on positions on the T-shaped structure, the ITR sequences can be divided into various segments such as A, B, B', C', C, A', and D. On the ITR sequences, A and A' are complementary, B and B' are complementary, C and C' are complementary, and D and D' are complementary. Structurally, the ITR sequences include two palindrome arms (B'-B (SEQ ID NO: 7, 5'-cgggcgacctttggtcgcccgg-3') and C-C' (SEQ ID NO: 8, 5'-cgcccgggcaaagcccgggcg-3')) and a long-stemmed palindrome (A'-A). The segment D' is located in an ITR sequence at a 5' terminus of the genome of AAV, and the segment D is located in an ITR sequence at a 3' terminus of the genome of AAV.

rAAV: rAAV refers to an AAV obtained by modifying a genome of a wild-type (WT) AAV. rAAV typically has a capsid protein and structure of WT AAV, but the protein-coding sequences (rep and cap genes) in a genome of WT AAV are replaced by a target gene (such as a therapeutic gene), and only the ITR sequences at two termini are retained. An important role of rAAV is to serve as a vector for gene therapy.

Helper plasmid: The helper plasmid is a helper plasmid for preparing rAAV. To prepare rAAV, a host cell (such as a mammalian or insect cell) generally needs to be co-transfected with three plasmids: a helper plasmid pADhelper that provides four adenovirus elements; a helper plasmid pRC that provides coding sequences of AAV Rep and Cap proteins, where a Rep protein is responsible for replication of a genome of AAV and assistance in assembly of genomic particles of AAV, and a Cap protein is responsible for production of a capsid of AAV; and a target sequence (such as a therapeutic gene)-containing plasmid that can be referred to as pGOI.

AD' sequence: The AD' sequence refers to a sequence formed through the combination of segments A and D' described above. In a specific embodiment, the AD' sequence is a sequence shown in SEQ ID NO: 3.

DA' sequence: The DA' sequence refers to a sequence formed through the combination of segments D and A' described above. In a specific embodiment, the DA' sequence is a sequence shown in SEQ ID NO: 4.

In the embodiments described herein, unless otherwise indicated, the AD' sequence and the DA' sequence may be used interchangeably, for example, when the AD' sequence is mentioned, it should be understood that the DA' sequence is also mentioned.

Sequence identity: When a nucleotide sequence is mentioned, the term "sequence identity" refers to a degree of consistency between two nucleotide sequences (such as a query sequence and a reference sequence), and is generally expressed in a percentage. In general, before a percentage of consistency between two nucleotide sequences is calculated, sequence alignment is conducted and a gap (if any) is introduced. If bases in two sequences at a specified alignment position are the same, the two sequences are considered to be consistent or matched at this position; and if bases in two sequences at a specified alignment position are different, the two sequences are considered to be inconsistent or mismatched at this position. In some algorithms, a number of matched positions are divided by a total number of positions in an alignment window to obtain a sequence identity. In some other algorithms, a number of gaps and/or a length of gaps are also taken into account. For the purpose of the present application, the public alignment software BLAST (available on the website: ncbi.nlm.ih.gov) may be adopted, and with default settings, the optimal sequence alignment is allowed and a sequence identity between two nucleotide sequences is calculated.

Functional variant: The functional variant refers to a nucleic acid obtained through a variation of at least one nucleotide (including replacement, addition, or deletion) in a basic nucleic acid, but the nucleic acid obtained after the variation basically retains the original biological functions. After exemplary nucleic acid sequences are given, those skilled in the art can seek to obtain functional variants of these nucleic acid sequences through conventional experimental methods. Thus, in some embodiments, the P5 promoter sequence included in the pRC helper plasmid provided herein may include a sequence shown in SEQ ID NO: 2. In some other embodiments, the P5 promoter sequence may be a functional variant having a sequence identity of at least 90% (such as at least 95% or at least 98%) with the sequence shown in SEQ ID NO: 2. In some embodiments, the DA' sequence included in the pRC helper plasmid provided herein may include a sequence shown in SEQ ID NO: 4. In some other embodiments, the DA' sequence is a functional variant having a sequence identity of at least 90% (such as at least 92%, at least 95%, or at least 98%) with the sequence shown in SEQ ID NO: 4. In some embodiments, the AD' sequence included in the pRC helper plasmid provided herein may include a sequence shown in SEQ ID NO: 3. In some other embodiments, the AD' sequence is a functional variant having a sequence identity of at least 90% (such as at least 92%, at least 95%, or at least 98%) with the sequence shown in SEQ ID NO: 3.

All pRC-series vectors involved in the present application are obtained by a conventional molecular cloning method.

In the pRC helper plasmid provided herein, the P5 promoter is used in combination with the DA' sequence or AD' sequence, which can significantly improve a yield of rAAV.

The present application is further elaborated below through specific examples. In the present application, unless otherwise specified, a concentration of a solid or liquid reagent refers to a mass concentration, and a concentration of a gas refers to a volume concentration.

EXAMPLES

By designing combinations containing various numbers and arrangement positions of DA' or AD' sequences and P5 promoters, different candidate helper plasmids containing Rep2Cap2 were constructed based on a backbone vector (SEQ ID NO: 1) by a conventional molecular cloning method (FIG. 2), and then virus-producing titers of the helper plasmids in a common three-plasmid transfection system were compared in parallel.

Brief steps of three-plasmid transfection to produce AAV:

1) About $3\times10^5$ of 293T cells (293T, derived from ATCC® CRL-3216™) were inoculated into a 24-well plate, a high-sugar DMEM medium including 10% fetal bovine serum (FBS), 2 mM L-glutamine (ATCC 30-2214), and 1% Penicillin/Streptomycin was added, and the cells were cultivated at 37° C. and 5% $CO_2$ for about 16 h, where a cell density during transfection was about 60% to 70%.

2) pRC and pAdHleper helper vectors (vector source: UPENN vector core PL-F-PVADF6, the University of Pennsylvania) and an AAV plasmid containing the fluorescent protein gene driven by a CAG promoter (pAAV.CAG.EGFP) were added to 0.5 mL of DMEM according to a ratio of 0.5 μg:0.5 μg:0.5 μg, then 3 μL of polyethylenimine (PEI) (1 μg/μL) was added, and a resulting mixture was immediately mixed and placed at room temperature for 10 min to obtain a mixed medium for transfection; and the medium in the 24-well plate was removed, the mixed medium for transfection was added, and the cells were further cultivated in a 37° C. incubator (5% $CO_2$ concentration).

3) After the cells were further cultivated for 72 h, cells and supernatant were collected, repeatedly frozen and thawed (thawing and freezing each were conducted for 2 min) three times in a 37° C. water bath and a dry ice-ethanol bath, respectively, and then centrifuged at 10,000 g for 10 min to obtain a supernatant, which was an AAV crude extract.

A method for titer determination of AAV:

Sequences of ITRs of all types of AAV vectors were specifically detected using primers

```
FWD ITR
                              (SEQ ID NO: 5)
(5'-GGAACCCCTAGTGATGGAGTT)
and

REV ITR
                              (SEQ ID NO: 6)
(5'-CGGCCTCAGTGAGCGA)
```

(1) Digestion of a Sample by Dnase I

Components of a reaction system were listed in the table below.

| Reagent | X1 |
|---|---|
| Nuclease-free Water | 15.8 μL |
| 10x DNase Buffer | 2 μL |
| DNase I, RNase free 1 (70 U/μL) (purchased from Roche) | 0.2 μL |
| Sample | 2 μL |

5 μL of a sample was taken and diluted 20-fold; a corresponding number of PCR tubes were prepared; 18 μL of a digestion solution was added to each tube, and then 2 μL of a diluted sample and 2 μL of a plasmid standard (including $4\times10^8$ of AAV copies (Genome Copies, GC) as a DNase digestion control) for plotting a standard curve, where the diluted sample was further diluted 10-fold; the tubes were incubated at 37° C. for 30 min; and after digestion was completed, 5 μL of a sample was taken and added to 95 μL of water, and the dilution was conducted 2 times serially until the sample was diluted 80,000-fold, but RefAAV (plasmid standard) was serially diluted 4,000-fold.

(2) SYBR GreenqPCR

Standard preparation: A plasmid standard including $2\times10^8$ of AAV copies/μL was taken and subjected to 6 serial dilutions with 8 μL of standard+72 μL of water. A first gradient concentration was $2\times10^8$ GC/μL, and it was set to $8\times10^{14}$ GC/mL in software to reflect a dilution gradient of a sample. Subsequent gradient concentrations were $8\times10^{13}$ GC/mL, $8\times10^{12}$ GC/mL, $8\times10^{11}$ GC/mL, $8\times10^{10}$ GC/mL, and $8\times10^9$ GC/mL, respectively.

Components of a reaction system were listed in the table below.

| Reagent | Vol. per reaction |
|---|---|
| SYBR PCR reagent (2X) | 10 μL |
| ROX (50X) | 0.4 μL |
| FWD ITR (50 μM) | 0.1 μL |
| REV ITR (50 μM) | 0.1 μL |
| Nuclease-free water | 4.4 μL |
| Sample DNA | 5 μL |

With 3 replicate wells per sample, a corresponding volume of a mixture was prepared, 18 μL of the mixture was added per well, and then 2 μL of a sample was added per well.

(3) SYBR Green qPCR Conditions

Pre-denaturation: 95° C. for 10 min;

Cycling: 40 cycles: 95° C. for 15 s, and 60° C. for 1 min.

Figure 3:
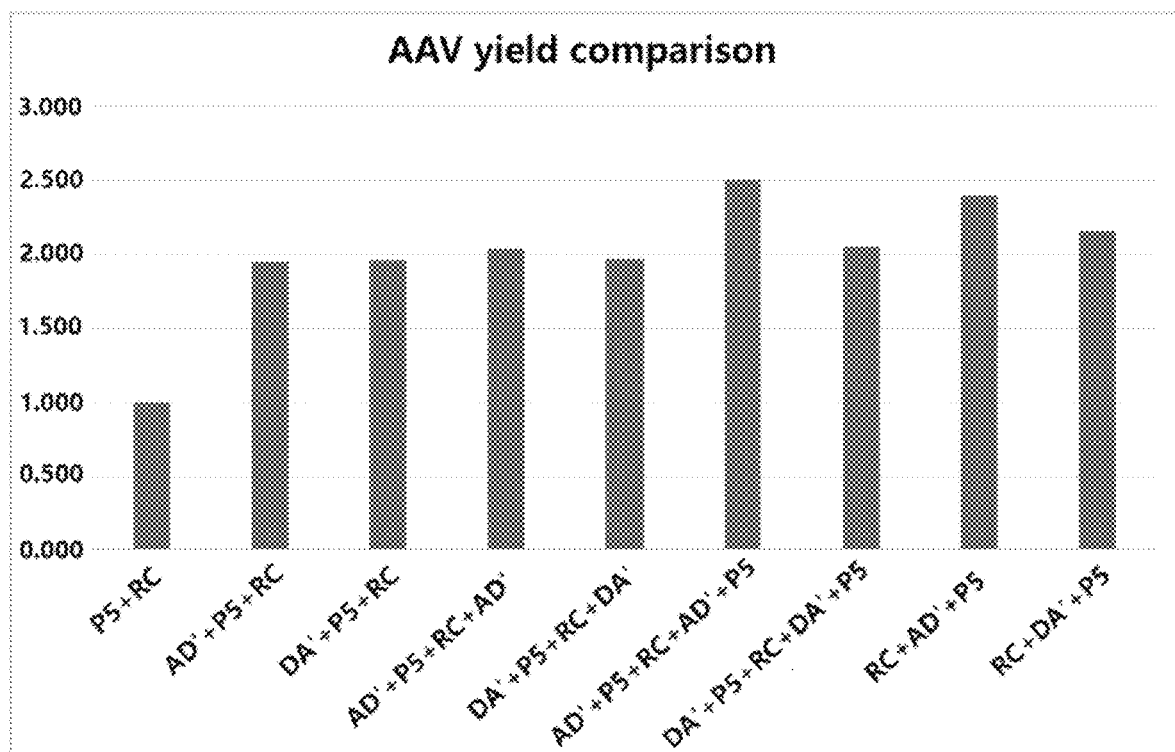
FIG. 3 shows results of comparison of a viral titer of a lysate of each plasmid tested in an embodiment with a control vector.

All titer test results were converted into fold relationships relative to a control vector P5+RC, and the fold relationships were shown in FIG. 3. The results show that the helper plasmid containing a DA' sequence or an AD' sequence has an effect of increasing a yield of rAAV compared with Rep2Cap2 vector "P5+RC" driven by a single P5 promoter.

A helper plasmid of a specific serotype (Rep2Cap2) is used in the examples. Those skilled in the art should understand that the present application is not limited to this specific serotype, but helper plasmids of other serotypes currently known and to be found in the future may be used to implement the present application.

Some of the nucleic acid sequences mentioned herein are as follows:

Plasmid backbone sequence (SEQ ID NO: 1):
aagccgaattctgcagatatccatcacactggcggccgct
cgactagagcggccgccaccgcggtggagctccagctttt
gttccctttagtgagggttaattgcgcgcttggcgtaatc
atggtcatagctgtttcctgtgtgaaattgttatccgctc
acaattccacacaacatacgagccggaagcataaagtgta
aagcctggggtgcctaatgagtgagctaactcacattaat
tgcgttgcgctcactgcccgctttccagtcgggaaacctg
tcgtgccagctgcattaatgaatcggccaacgcggggag
aggcggtttgcgtattgggcgctcttccgcttcctcgctc
actgactcgctgcgctcggtcgttcggctgcggcgagcgg
tatcagctcactcaaaggcggtaatacggttatccacaga
atcagggataacgcaggaaagaacatgtgagcaaaaggc
cagcaaaaggccaggaaccgtaaaaaggccgcgttgctgg
cgttttccataggctccgcccccctgacgagcatcacaa
aaatcgacgctcaagtcagaggtggcgaaacccgacagga
ctataaagataccaggcgtttccccctggaagctccctcg
tgcgctctcctgttccgaccctgccgcttaccggatacct
gtccgcctttctcccttcgggaagcgtggcgctttctcat
agctcacgctgtaggtatctcagttcggtgtaggtcgttc
gctccaagctgggctgtgtgcacgaaccccccgttcagcc
cgaccgctgcgccttatccggtaactatcgtcttgagtcc
aacccggtaagacacgacttatcgccactggcagcagcca
ctggtaacaggattagcagagcgaggtatgtaggcggtgc
tacagagttcttgaagtggtggcctaactacggctacact
agaagaacagtatttggtatctgcgctctgctgaagccag
ttaccttcggaaaaagagttggtagctcttgatccggcaa
acaaaccaccgctggtagcggtggtttttttgtttgcaag
cagcagattacgcgcagaaaaaaaggatctcaagaagatc
ctttgatcttttctacggggtctgacgctcagtggaacga
aaactcacgttaagggattttggtcatgagattatcaaaa
aggatcttcacctagatccttttaaattaaaaatgaagtt
ttaaatcaatctaaagtatatatgagtaaacttggtctga
cagttaccaatgcttaatcagtgaggcacctatctcagcg
atctgtctatttcgttcatccatagttgcctgactccccg
tcgtgtagataactacgatacgggagggcttaccatctgg
ccccagtgctgcaatgataccgcgagacccacgctcaccg
gctccagatttatcagcaataaaccagccagccggaaggg
ccgagcgcagaagtggtcctgcaacttatccgcctccat ccagtctattaattgttgccgggaagctagagtaagtagt
tcgccagttaatagtttgcgcaacgttgttgccattgcta
caggcatcgtggtgtcacgctcgtcgtttggtatggcttc
attcagctccggttcccaacgatcaaggcgagttacatga
tcccccatgttgtgcaaaaaagcggttagctccttcggtc
ctccgatcgttgtcagaagtaagttggccgcagtgttatc
actcatggttatggcagcactgcataattctcttactgtc
atgccatccgtaagatgcttttctgtgactggtgagtact
caaccaagtcattctgagaatagtgtatgcggcgaccgag
ttgctcttgcccggcgtcaatacgggataataccgcgcca
catagcagaactttaaaagtgctcatcattggaaaacgtt
cttcggggcgaaaactctcaaggatcttaccgctgttgag
atccagttcgatgtaacccactcgtgcacccaactgatct
tcagcatcttttactttcaccagcgtttctgggtgagcaa
aaacaggaaggcaaaatgccgcaaaaaagggaataagggc
gacacggaaatgttgaatactcatactcttccttttttcaa
tattattgaagcatttatcagggttattgtctcatgagcg
gatacatatttgaatgtatttagaaaaataaacaaatagg
ggttccgcgcacatttccccgaaaagtgccacctaaattg
taagcgttaatattttgttaaaattcgcgttaaatttttg
ttaaatcagctcattttttaaccaataggccgaaatcggc
aaaatcccttataaatcaaaagaatagaccgagatagggt
tgagtgttgttccagtttggaacaagagtccactattaaa
gaacgtggactccaacgtcaaagggcgaaaaaccgtctat
cagggcgatggcccactacgtgaaccatcaccctaatcaa
gttttttggggtcgaggtgccgtaaagcactaaatcggaa
ccctaaagggagccccccgatttagagcttgacggggaaag
ccggcgaacgtggcgagaaaggaagggaagaaagcgaaag
gagcgggcgctagggcgctggcaagtgtagcggtcacgct
gcgcgtaaccaccacacccgccgcgcttaatgcgccgcta
cagggcgcgtcccattcgccattcaggctgcgcaactgtt
gggaagggcgatcggtgcgggcctcttcgctattacgcca
gctggcgaaaggggatgtgctgcaaggcgattaagttgg
gtaacgccagggttttcccagtcacgacgttgtaaaacga
cggccagtgagcgcgcgtaatacgactcactatagggcga
attgggtaccgggccccccctcgaggtcgacggtat
cgggggagct -continued P5 promoter sequence (SEQ ID NO: 2):
aggtcctgtattagaggtcacgtgagtgttttgcgacat tttgcgacaccatgtggtcacgctgggtatttaagcccga gtgagcacgcagggtctccattttgaagcgggaggtttga acgcgcagccgcc AD' sequence (SEQ ID NO: 3):
gcctcagtgagcgagcgagcgcgcagagagggagtggcc aactccatcactaggggttcct DA' sequence (SEQ ID NO: 4):
aggaaccccctagtgatggagttggccactccctctctgc gcgctcgctcgctcactgaggc

CITED REFERENCES

1. Xiao X, Li J, Samulski R J. Production of high-titer recombinant adeno-associated virus vectors in the absence of helper adenovirus. J Virol. 1998 March; 72(3):2224-32. doi: /JVI.72.3.2224-2232.1998. PMID: 9499080; PMCID: PMC109519.
2. Flotte T R, Afione S A, Solow R, Drumm M L, Markakis D, Guggino W B, Zeitlin P L, Carter B J. Expression of the cystic fibrosis transmembrane conductance regulator from a novel adeno-associated virus promoter. J Biol Chem. 1993 Feb. 15; 268(5):3781-90. PMID: 7679117.
3. Zhang L, Wang D H, Fischer H, Fan P D, Widdicombe J H, Kan Y W, Dong J Y. Efficient expression of CFTR function with adeno-associated virus vectors that carry shortened CFTR genes. PNAS.1998 Aug. 18; 95 (17) 10158-10163.

The invention claimed is:

1. A helper plasmid for preparing a recombinant adeno-associated virus (rAAV), comprising:
   (1) a coding sequence of an AAV Rep protein and a coding sequence of an AAV Cap protein;
   (2) at least one promoter sequence; and
   (3) at least one DA' sequence or AD' sequence, wherein the AD' sequence is a reverse complementary sequence of the DA' sequence;
   wherein the DA' sequence is set forth in SEQ ID NO: 4; the AD' sequence is set forth in SEQ ID NO: 3,
   wherein the at least one promoter sequence is a sequence of a P5 promoter, and
   the sequence of the P5 promoter is set forth in SEQ ID NO: 2.

2. The helper plasmid according to claim 1, wherein the at least one DA' sequence or AD' sequence is located upstream of the coding sequence of the Rep protein and the coding sequence of the Cap protein.

3. The helper plasmid according to claim 1, wherein the at least one DA' sequence or AD' sequence is located downstream of the coding sequence of the Rep protein and the coding sequence of the Cap protein.

4. The helper plasmid according to claim 1, wherein the helper plasmid comprises sequentially from 5' to 3':
   (i) a DA' sequence or an AD' sequence, a promoter sequence, and a coding sequence of a Rep protein and a coding sequence of an AAV Cap protein;
   (ii) a DA' sequence or an AD' sequence, a promoter sequence, a coding sequence of a Rep protein and a coding sequence of a Cap protein, and a DA' sequence or an AD' sequence;
   (iii) a DA' sequence or an AD' sequence, a promoter sequence, a coding sequence of a Rep protein and a coding sequence of an AAV Cap protein, a DA' sequence or an AD' sequence, and a promoter sequence; or
   (iv) a coding sequence of a Rep protein and a coding sequence of a Cap protein, a DA' sequence or an AD' sequence, and a promoter sequence.

5. The helper plasmid according to claim 1, wherein the Rep protein and the Cap protein are derived from adeno-associated virus serotype 2 (AAV2).

6. The helper plasmid according to claim 4, wherein the Rep protein and the Cap protein are derived from AAV2.

7. A method for increasing a production capacity of a rAAV, comprising: transforming a host cell with the helper plasmid according to claim 1.

8. A method for increasing a production capacity of a rAAV, comprising: transforming a host cell with the helper plasmid according to claim 4.

* * * * *